(12) United States Patent
Eyben et al.

(10) Patent No.: US 9,588,137 B2
(45) Date of Patent: Mar. 7, 2017

(54) METHOD FOR DETERMINING LOCAL RESISTIVITY AND CARRIER CONCENTRATION USING SCANNING SPREADING RESISTANCE MEASUREMENT SET-UP

(71) Applicant: IMEC, Leuven (BE)

(72) Inventors: Pierre Eyben, Leuven (BE); Wilfried Vandervorst, Leuven (BE); Ruping Cao, Leuven (BE); Andreas Schulze, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/019,576

(22) Filed: Sep. 6, 2013

(65) Prior Publication Data
US 2014/0068822 A1 Mar. 6, 2014

Related U.S. Application Data

(60) Provisional application No. 61/697,449, filed on Sep. 6, 2012.

(51) Int. Cl.
*G01Q 60/30* (2010.01)
*H01L 21/66* (2006.01)
*B82Y 35/00* (2011.01)

(52) U.S. Cl.
CPC ............ *G01Q 60/30* (2013.01); *H01L 22/14* (2013.01); *B82Y 35/00* (2013.01)

(58) Field of Classification Search
CPC ...... G01Q 60/30; G01Q 60/40; Y10S 977/85; Y10S 977/871; H01L 22/14; B82Y 35/00
(Continued)

(56) References Cited

U.S. PATENT DOCUMENTS 5,585,734 A * 12/1996 Meuris et al. ................. 324/719
5,995,912 A * 11/1999 DeWolf et al. ................. 702/85
(Continued)

OTHER PUBLICATIONS

Ghosh. A. K. Introduction to Measurements and Instrumentation 2nd Ed. (2007 by Prentice-Hall of Indai Private Limited, New Delhi) p. 381, ISBN-81-203-3120-6.*
(Continued)

*Primary Examiner* — Wyatt Stoffa
(74) *Attorney, Agent, or Firm* — McDonnell Boehnen Hulbert & Berghoff LLP

(57) ABSTRACT

The disclosure is related to an SSRM method for measuring the local resistivity and carrier concentration of a conductive sample. The method includes contacting the conductive sample at one side with an AFM probe and at another side with a contact electrode, modulating, at a modulation frequency, the force applied to maintain physical contact between the AFM probe and the sample while preserving the physical contact between the AFM probe and the sample, thereby modulating at the modulation frequency the spreading resistance of the sample; measuring the current flowing through the sample between the AFM probe and the contact electrode; and deriving from the measured current the modulated spreading resistance. Deriving the modulated spreading resistance includes measuring the spreading current using a current-to-voltage amplifier, converting the voltage signal into a resistance signal, and filtering out from the resistance signal, the resistance amplitude at the modulation frequency.

8 Claims, 11 Drawing Sheets

(58) Field of Classification Search
 USPC ............................. 850/33, 36; 324/722–724
 See application file for complete search history.

(56) References Cited

U.S. PATENT DOCUMENTS

| | | | | |
|---|---|---|---|---|
| 6,668,628 | B2* | 12/2003 | Hantschel | B82Y 35/00 73/105 |
| 6,761,074 | B2* | 7/2004 | Prakash | B82Y 35/00 73/827 |
| 6,912,894 | B2* | 7/2005 | Prakash | 73/105 |
| 2002/0157457 | A1* | 10/2002 | Vandervorst | B82Y 35/00 73/105 |
| 2004/0069052 | A1* | 4/2004 | Prakash | B82Y 35/00 73/105 |
| 2011/0219479 | A1* | 9/2011 | Proksch | B82Y 35/00 850/1 |

OTHER PUBLICATIONS

Rao K. R., et al, Fast Fourier Transform: Algorithms and Applicatiions (Springer Science+Business Media B.V. 2010) p. 2, ISBN 978-1-4020-6628-3.*

Inverting Amplifier. Electronics-Tutorials, [retrieved on Jul. 12, 2011]. Retrieved from the Internet <URL: http://web.archive.org/web/20110712211117/http://www.electronics-tutorials.ws/opamp/opamp_2.html>.*

Schulze, Andreas, et al. "A comprehensive model for the electrical nanocontact on germanium for scanning spreading resistance microscopy applications." Journal of Applied Physics 113.11 (2013): 114310.*

Schulze, Andreas, et al. "Outwitting the series resistance in scanning spreading resistance microscopy." Ultramicroscopy 161 (2016): 59-65.*

Eyben, Pierre, et al. "Pulsed Force-Scanning Spreading Resistance Microscopy (PF-SSRM) for high spatial resolution 2D-dopant profiling." MRS Proceedings. vol. 717. Cambridge University Press, 2002.*

* cited by examiner

US 9,588,137 B2

METHOD FOR DETERMINING LOCAL RESISTIVITY AND CARRIER CONCENTRATION USING SCANNING SPREADING RESISTANCE MEASUREMENT SET-UP

CROSS REFERENCE TO RELATED APPLICATIONS

Pursuant to the provisions of 35 U.S.C. §119(e), this application claims priority to U.S. Provisional Patent Application Ser. No. 61/697,449, which was filed Sep. 6, 2012, the entire contents of which are incorporated herein by reference.

FIELD

The present disclosure is related to scanning spreading resistance measurement, also known as SSRM.

BACKGROUND

In the semiconductor industry, metrology plays a major role in the development of technology, as it allows providing the necessary information to characterize the features and properties of integrated devices. With the emergence of device concepts whereby dimensions are shrinking and/or functionality is increased, further requirements on the characterization techniques are imposed. One of these requirements is to derive the two-dimensional (2D) and/or three-dimensional (3D) dopant and/or free charge carrier distribution of a doped region in the integrated device. This distribution determines to a great extent the device performance, in particular when further down-scaling the device dimensions.

Thanks to its high spatial resolution, high sensitivity and high signal-to-noise ratio, scanning spreading resistance microscopy (SSRM) is implemented for mapping the free charge carrier distribution of a doped region. This technique is derived from the spreading resistance probe (SRP) technique, but it uses a much smaller tip mounted on an atomic force microscope (AFM) to probe the local spreading resistance of the doped region.

Despite the advantages offered, state-of-the-art SSRM is less able to provide accurate information on the spatial distribution of the free charge carriers of higher doped semiconductor devices, such as a FinFET or a Nanowire FET, in particular when the dimensions of the doped regions are further scaled down.

SUMMARY

An alternative operational mode for SSRM is disclosed, which is called Force-Modulated SSRM allowing decoupling the spreading resistance from the total resistance measured.

This disclosure is related to a method for measuring the spreading resistance of a sample using scanning spreading resistance measurement, the method comprising: varying over time the contact force, measuring the corresponding variation of the resistance and deriving from the variation of the resistance the carrier concentration. In a preferred embodiment, the contact force is modulated at a modulation frequency and the amplitude of the corresponding modulated resistance is determined at this modulation frequency using FFT (Fast Fourier Transform) method. This embodiment is named FFT-SSRM.

This disclosure is related to a SSRM method for measuring the carrier concentration in a conductive sample, the method comprising: contacting the conductive sample at one side with an AFM probe and at another side with a contact electrode, modulating, at a modulation frequency, the force applied between the AFM probe and the sample, while preserving the physical contact, thereby modulating at the modulation frequency the spreading resistance of the sample; measuring the current flowing through the sample between the AFM probe and the contact electrode; and deriving from the measured modulated current the modulated spreading resistance. Preferably, the modulated spreading resistance is derived by measuring the spreading current using a current-to-voltage amplifier thereby converting the voltage signal into a resistance signal, and filtering out from the resistance signal the amplitude of the spreading resistance variation at the modulation frequency. In one embodiment, the amplitude of the spreading resistance is filtered out using a lock-in amplifier. In another embodiment, the amplitude of the spreading resistance is filtered out using FFT.

DRAWINGS

In order to teach the disclosure drawings are included. These drawings are not to scale and are used to illustrate embodiments of the disclosed method and operation of the measurement set-up.

FIG. 1 shows a schematic of a SSRM measurement set-up.

FIGS. 2a-b show the measured resistance for different dopant levels (1e16 cm-3, 5.8e16 cm-3, 8.8e17 cm-3, 5.0e17 cm-3, 5.0e19 cm-3) and additional series resistance (1 kΩ, 1.2 MΩ, 8 MΩ) whereby the applied force F is kept constant.

Figure 2A:
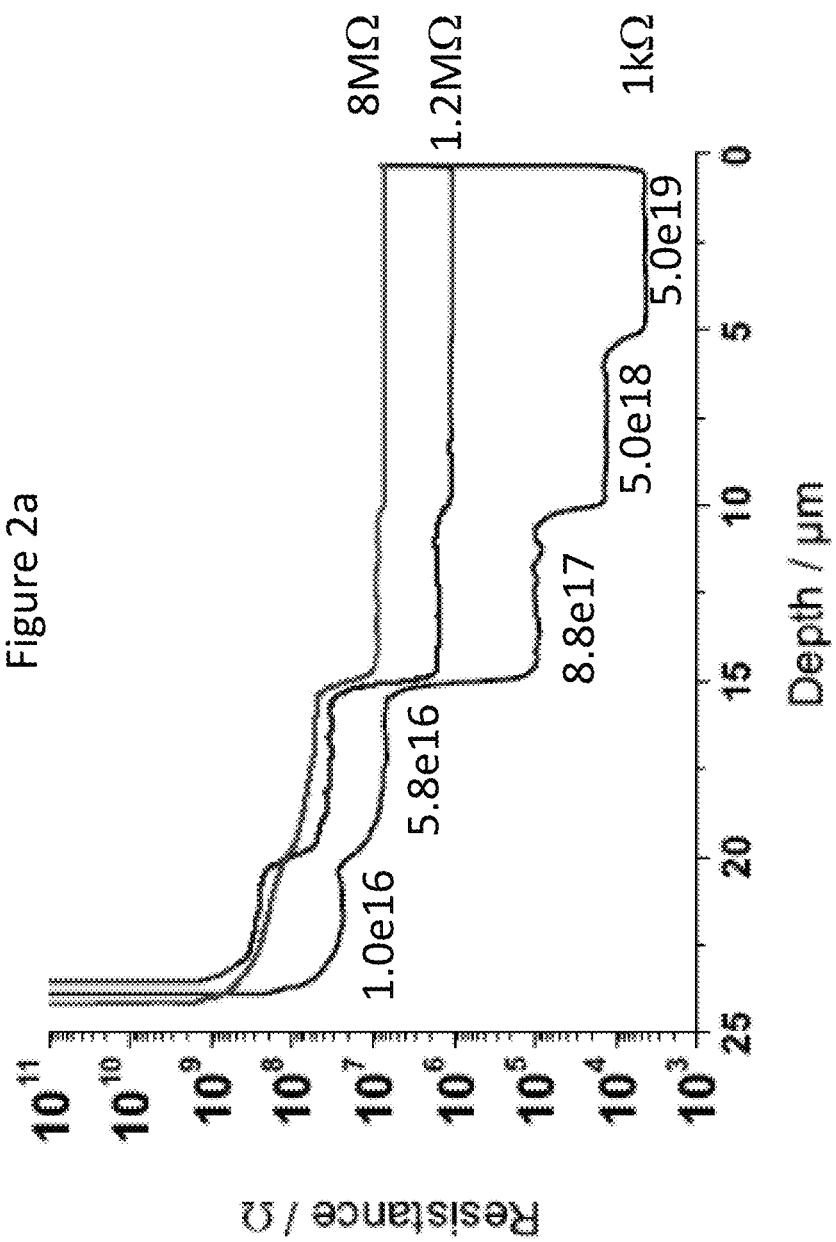
Figure 2B:
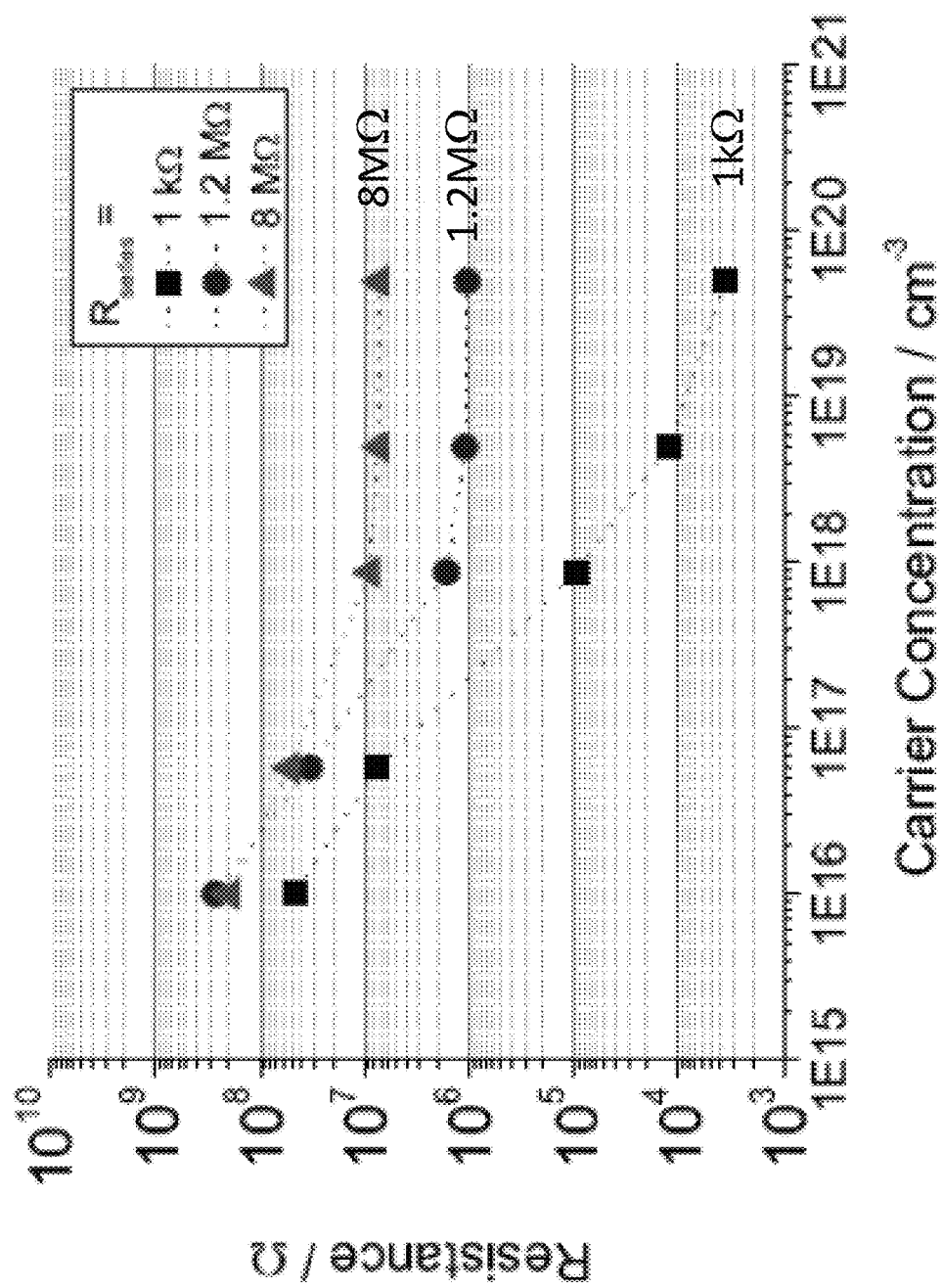
Figure 5A:
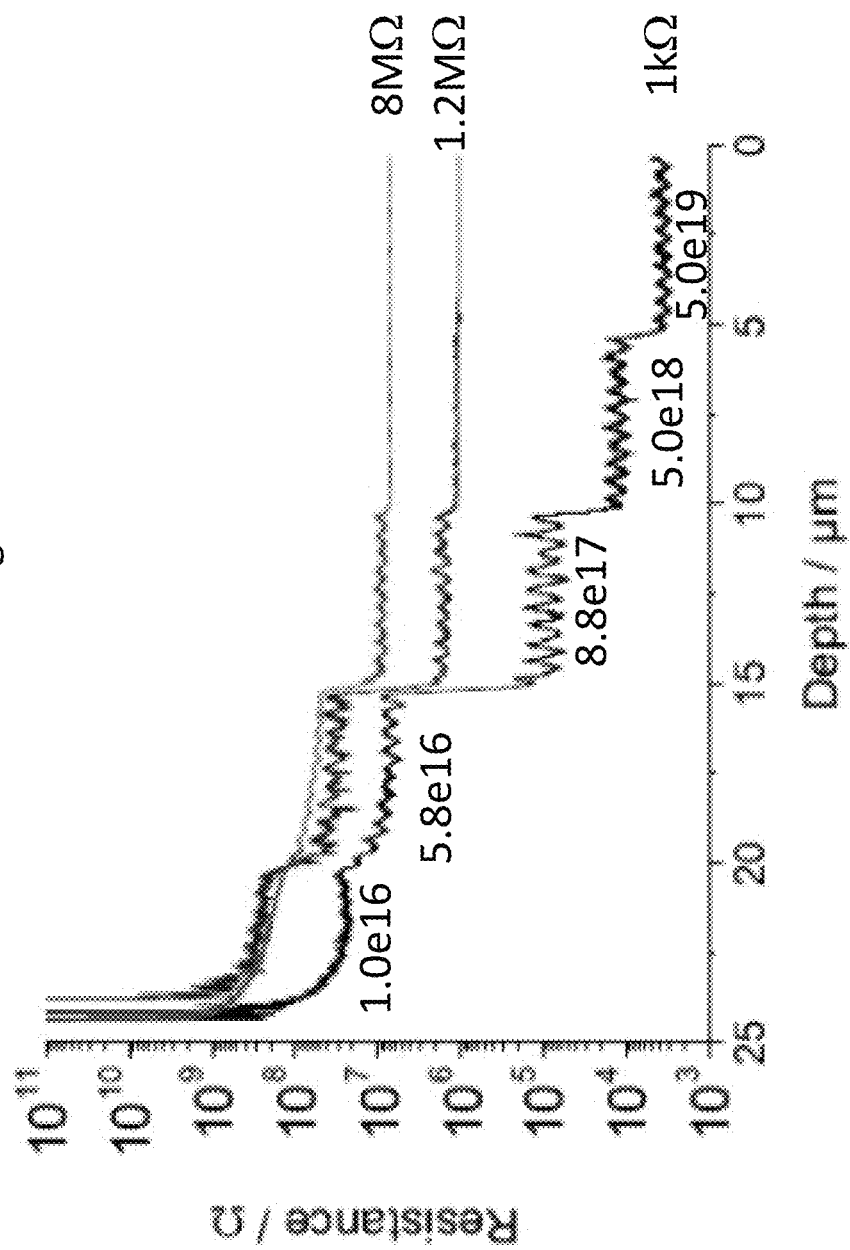
Figure 5B:
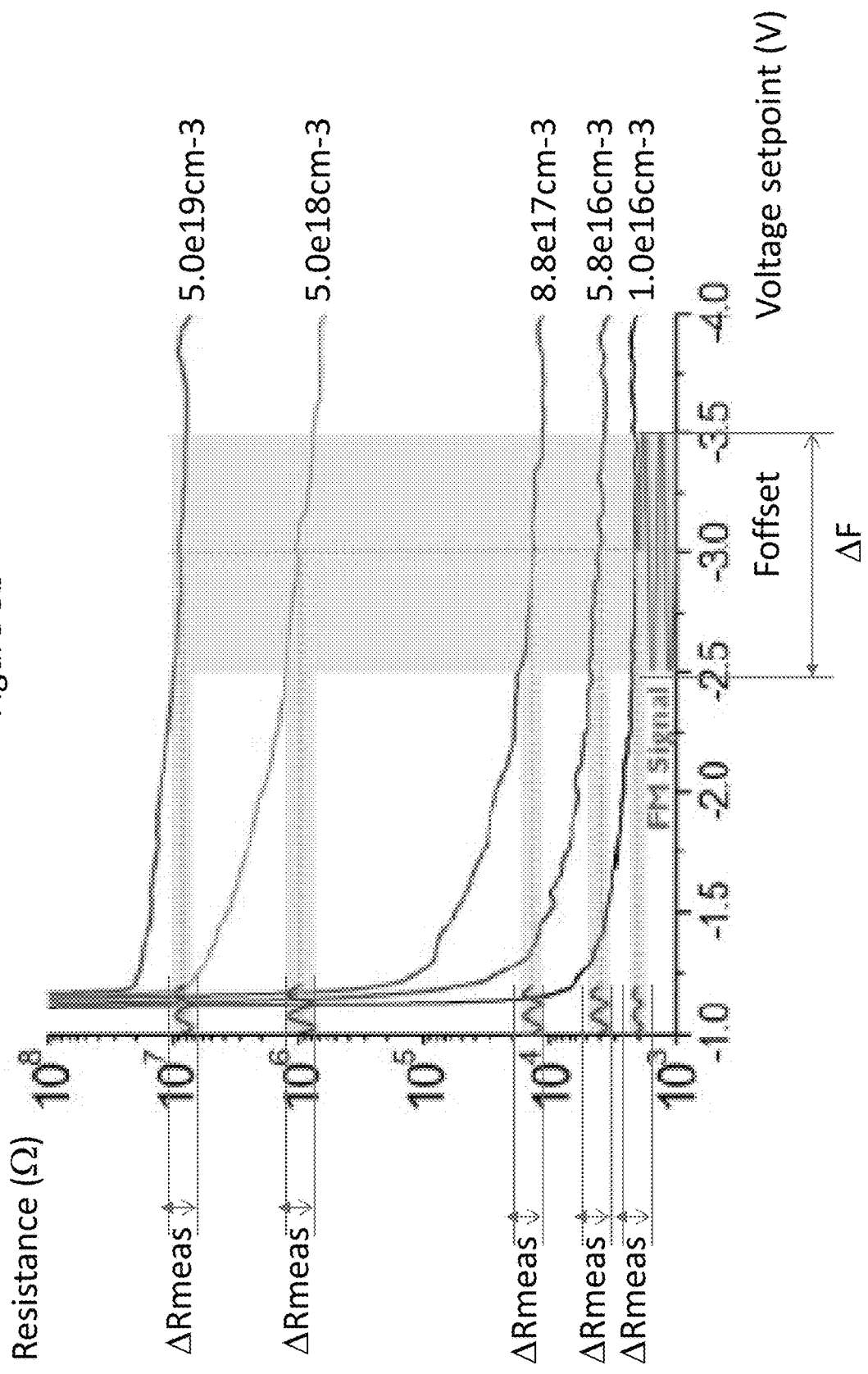
Figure 5C:
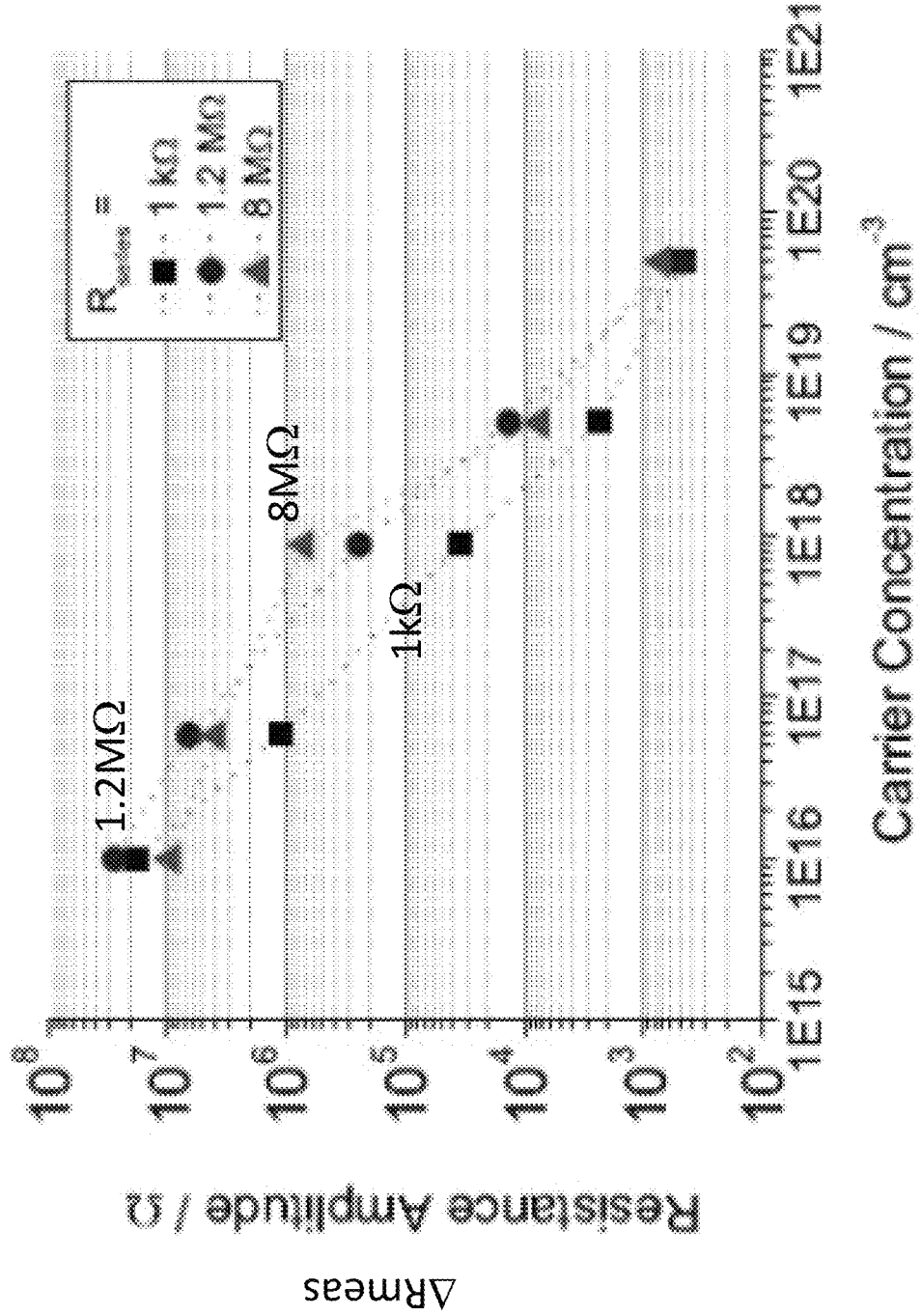

FIGS. 5a-c show the measured resistance for the samples shown in FIGS. 2a-b, whereby now the applied force F is modulated.

Figure 6:
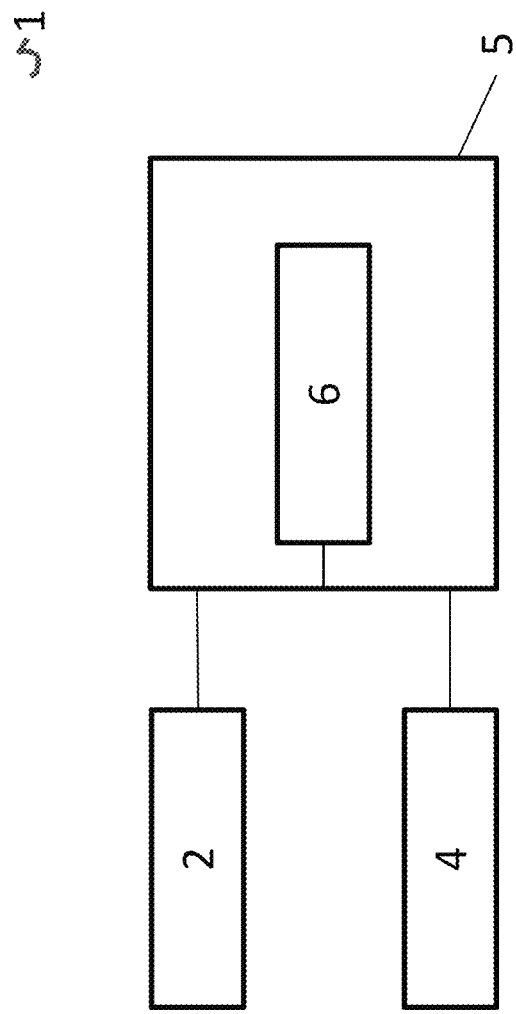

FIG. 6 shows a schematic of an SSRM measurement set-up.

Figure 7:
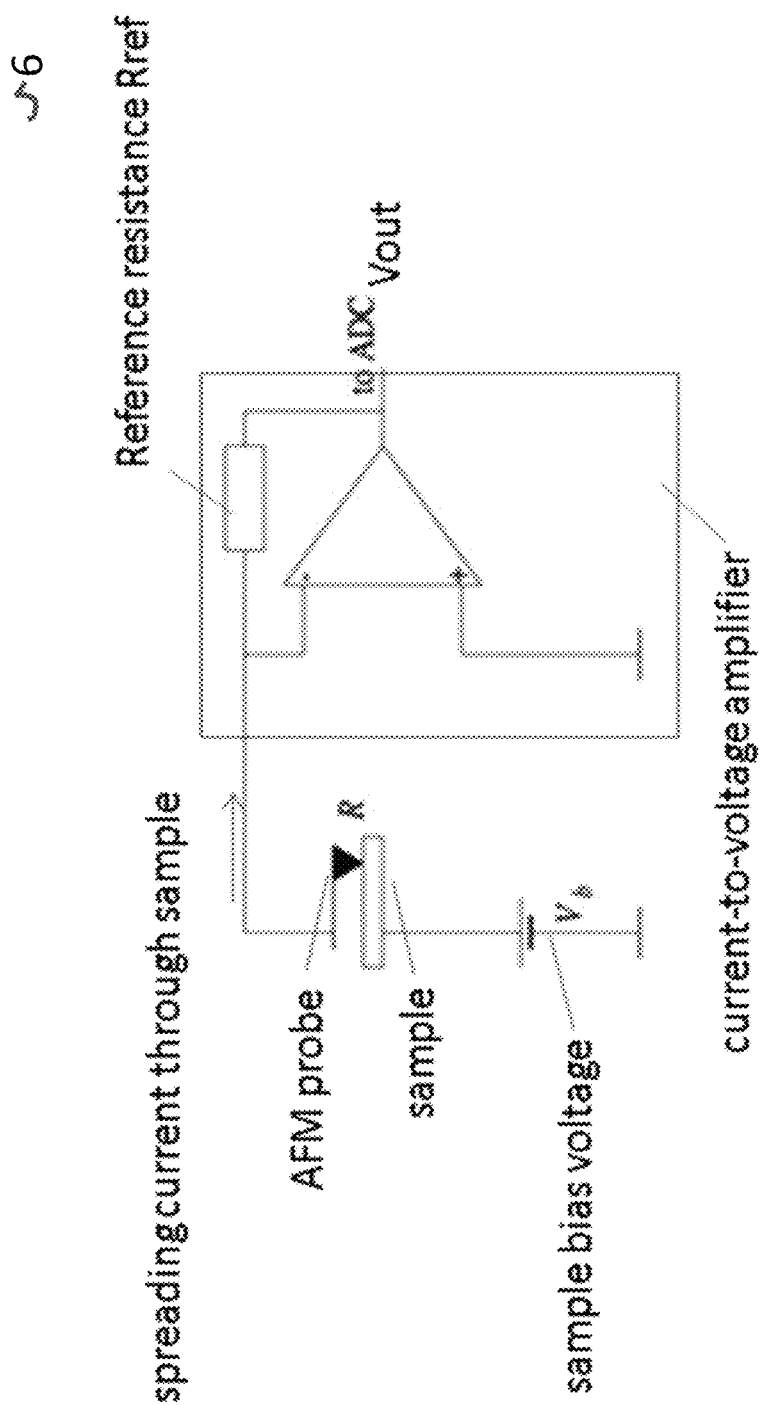

FIG. 7 shows a current-to-voltage amplifier for extracting the modulated resistance value.

Figure 8:
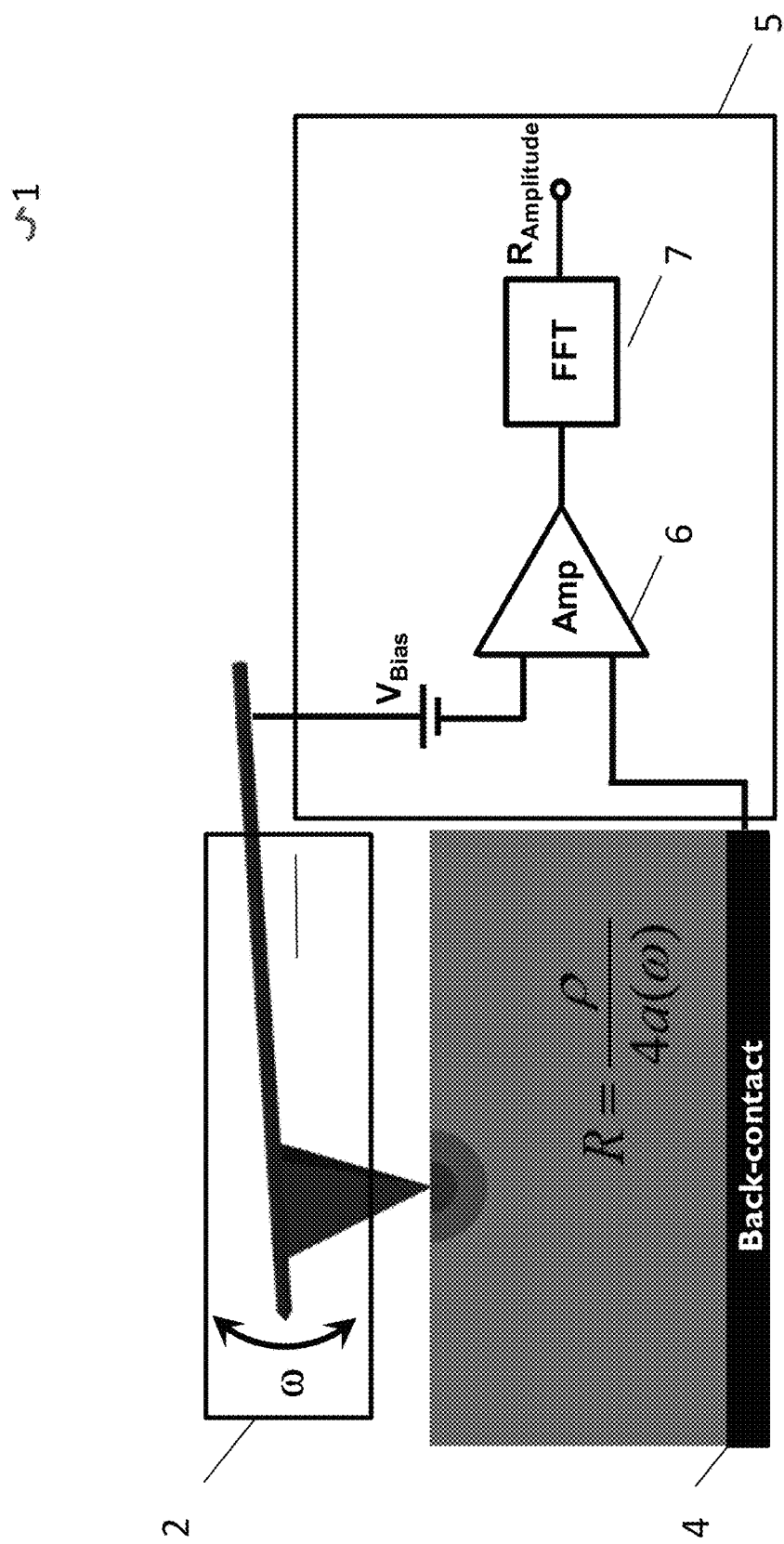

FIG. 8 shows a SSRM measurement set-up comprising an amplifier and a FFT transform unit.

DETAILED DESCRIPTION

This disclosure teaches extending the capability of SSRM for characterizing devices, where the contribution of the other series resistances to the measured resistance Rmeas can be dominating over the contribution of the spreading resistance. Hence, the total resistance measured is no more dominated by the spreading resistance, but by bulk or back-contact resistances.

$$R_{meas} = \frac{\rho_{sample}}{4 \cdot a} + R_{tip} + R_{bulk} + R_{BC}$$

Figure 1:
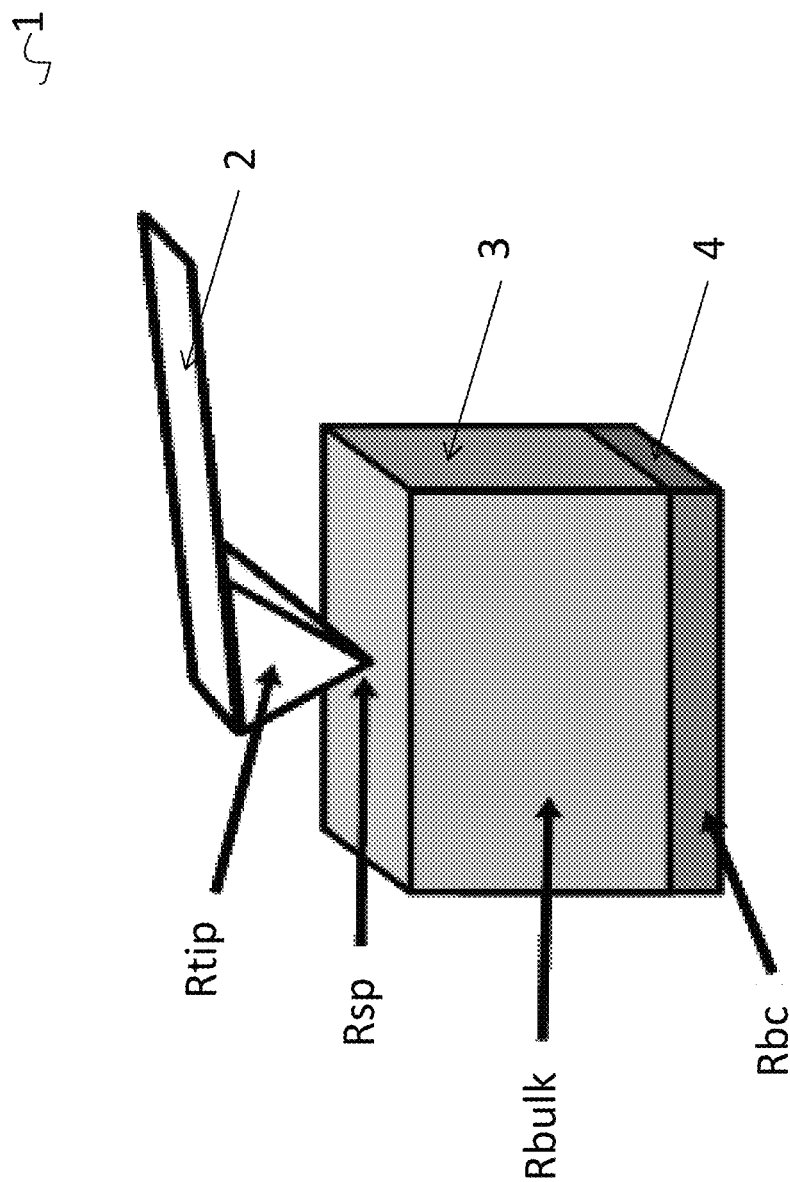

FIG. 1 shows a schematic of a sample in a scanning spreading resistance measurement (SSRM) set-up 1. The conductive sample 3 is contacted at one side with an AFM probe 2 and at another side with a contact electrode 4, often labeled as back-contact. During measurement, a voltage is applied over the sample by biasing the conductive AFM probe 2 and the contact electrode 4, thereby creating a current flowing from the AFM probe 2 towards the contact electrode 4. By controlling the voltage bias applied to piëzo-electric elements connected to the AFM probe 2, one can control the force F applied by the AFM probe 2 to the surface of the sample 3. The force F applied is selected to establish a permanent and stable physical contact between the AFM probe 2 and the sample 3 during the electrical measurement. In state-of-the-art SSRM, this force F is kept constant during the SSRM measurement. As shown in FIG. 1, the resistance Rmeas measured by the set-up 1 comprises several resistances connected in series. This total resistance Rmeas can be considered as the series connection of at least the resistance Rtip of the AFM probe 2, the spreading resistance Rsp of the sample 3, the resistance Rbulk of the trajectory of the current path through the sample 3 towards the contact electrode 4, and the resistance Rbc of this contact electrode 4.

With increasing dopant concentration and/or decreasing volume of the sample 3 and/or decreasing area of the contact electrode 4, the contribution of the other resistances to the total resistance might dominate the contribution of the spreading resistance Rsp of the sample 3. This effect is illustrated in FIGS. 2a-b. The total resistance Rmeas for 5 samples 3, each having a different dopant concentration ranging from 1e16 to 1e20 cm-3, was measured for 3 different values of a resistor Rseries additionally connected in series with the measurement set-up 1. This sample was formed by stacking 5 epitaxially grown silicon layers, each 5 μm (5 microns) thick, whereby every layer had a different p-type dopant concentration. The dopant concentration of each layer was verified using SIMS. The higher the dopant level of the sample 3, the higher the free charge concentration was and, hence, the lower the corresponding spreading resistance Rsp would be.

As shown in FIG. 2a, when this additional series resistance was increased from 1 kΩ (black, squares) to 1.2 MΩ (blue, circle) upto 8 MΩ (red, triangle), the measured total resistance curve shifted towards higher values as shown in FIG. 2a. Between the samples with the highest dopant concentration, i.e., above 1e18 cm-3, almost no difference could be seen in the measured total resistance as the resistance curves saturated. This effect was also seen in FIG. 2b showing the measured total resistance Rmeas as function of the dopant concentration. For higher dopant concentrations and higher series resistance, the measured total resistance is less determined by the dopant concentration of the sample 3.

Instead of deriving from the total resistance value Rmeas the spreading resistance Rsp, the derivative of this resistance Rmeas over the applied force F is determined. As the value of the spreading resistance Rsp is correlated with the magnitude of the force F applied by the AFM probe 2 on the sample 3, the contribution of the other series resistances can be removed from the measured resistance Rmeas, as the force-varying spreading resistance Rsp is the only term that effects the measurement outcome.

$$(\delta Rmeas(F)/\delta F)_F = (\delta Rsp(F)/\delta F)_F \quad (1)$$

with Rmeas is the measured resistance, F the force applied to the sample 3 and Rsp=ρ/4a with ρ being the semiconductor resistivity of the sample 3 and a being the radius of the contact between the AFM probe 2 and the sample 3. The contact between the AFM probe 2 and the sample 3 depends on the force F applied.

The variation of the spreading resistance Rsp with the applied force F, or the slope of the measured resistance curve over varying force F, increases monotonically as the carrier concentration decreases. The slope of the measured resistance curve can be correlated with the level of dopant concentration of the measured sample 3. The applied force F is varied such that the physical contact between the AFM probe 2 and the surface of the sample 3 is maintained during the measurement.

One can measure at a position on the surface of the sample 3 a resistance Rmeas—force F curve by sweeping the force F over a predetermined range, determine the slope ($\delta Rsp(F)/\delta F)_F$ of this curve and from this slope determine variation in the spreading resistance Rsp. From the thus obtained spreading resistance, one can derive the doping concentration at this position. This procedure can be repeated for different positions on the sample 3 while scanning its surface.

A more time-efficient approach of determining the spreading resistance Rsp at a position on the sample 3, is to modulate, at a modulation frequency fmod, the force F applied to maintain a physical contact between the AFM probe 2 and the sample 3. This variation ΔF in the applied force F is selected as to preserve the physical contact between the AFM probe 2 and the sample 3. By modulating the applied force F, the spreading resistance Rsp of the sample is modulated at this modulating frequency fmod. The current flowing through the sample 3 between the AFM probe 2 and the contact electrode 4 is measured. From the measured curve the modulated spreading resistance ΔRmeas is then derived.

Figure 3:
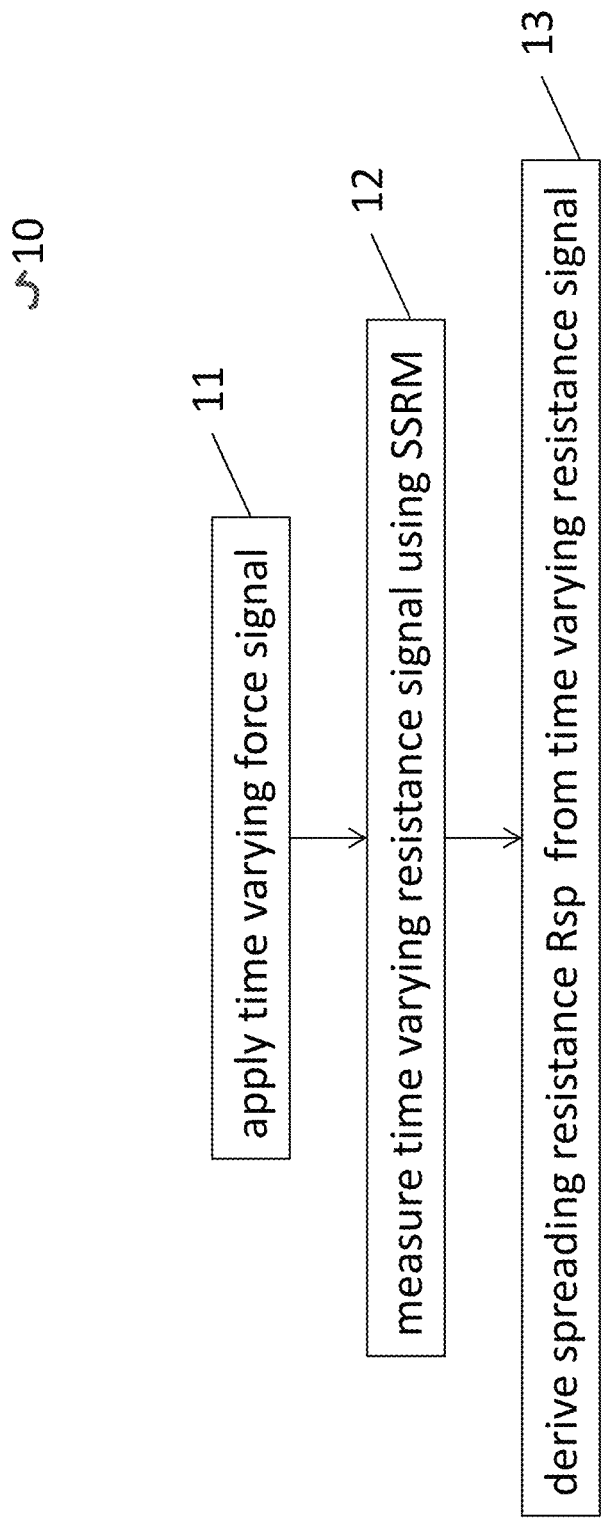
FIG. 3 shows a flow chart illustrating the force modulated scanning spreading resistance measurement.

The flowchart in FIG. 3 illustrates this force modulated scanning spreading resistance measurement approach 10. An offset value for the applied force F is selected to ensure that the AFM probe 2 is in physical contact with the sample 3. Then this applied force F is varied over time 11 while preserving the physical contact between the AFM probe 2 and the sample 3. While varying the applied force F, the resistance is measured 12. From the amplitude of the measured resistance the spreading resistance can be derived 13. Preferably, the modulated spreading resistance is determined by measuring the spreading current using a current-to-voltage amplifier, then converting the voltage signal into a resistance signal, and filtering out from the resistance signal the resistance amplitude (ΔRmeas) at the modulation frequency fmod. This resistance amplitude at the frequency of the piëzo-electric elements excitation (and thus force modulation) can be filtered from the measured resistance signal using Fast Fourier Transformation. Alternatively, the measured signal can be processed using a lock-in amplifier tuned to the modulation frequency fmod, thereby only processing that part of the measured resistance having this frequence fmod.

Typically, the applied Force is in the GPa range and the amplitude of this force is varied in the range from 20% up to 10%. The higher the variation of the force the better the signal-to-noise ratio of the measured resistance, but this might be at the expense of the spatial resolution. Depending on the desired repeatability and accuracy of the measurement, at each position the resistance is measured during one or more cycles of the modulated force signal.

Figure 4:
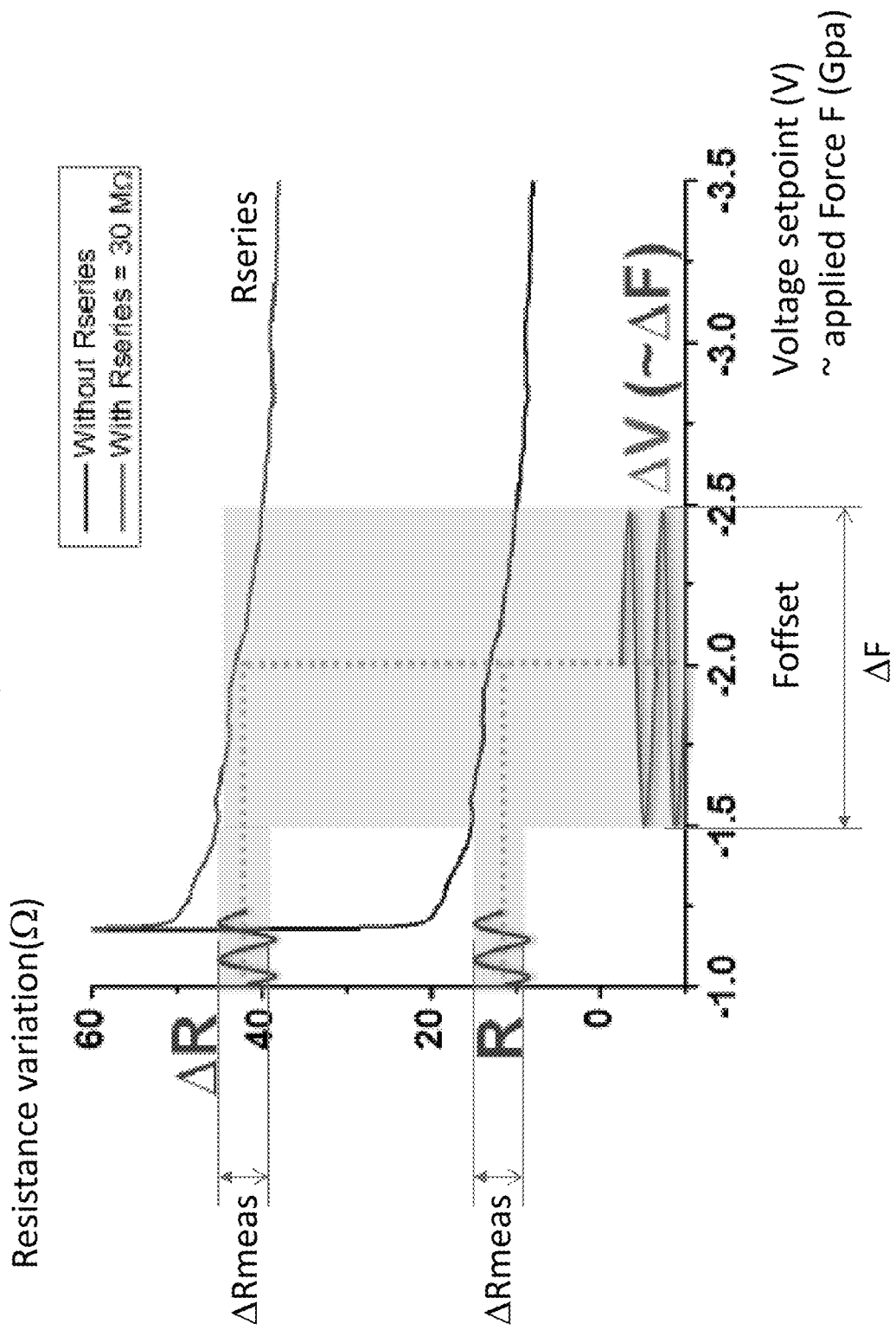
FIG. 4 shows the measured resistance variation for a dopant level (5.8e16 cm-3) and two values of additional series resistance (0, 30 MΩ) whereby the applied force F is modulated.

FIG. 4 illustrates this modulated force approach using a sample having a dopant concentration of 5.8e16 cm-3. By varying the voltage bias applied to piëzo-electric elements connected to the AFM probe 2, the amplitude of the applied force F is varied over a range ΔF. This causes the spreading Rsp, and the electrical current measured, to vary over of a range ΔR. If the series resistance increases, here simulated by adding an additional resistance of 30 MΩ to the measurement set-up 1, the curve shifts to higher values, but the slope of the curve at the modulated force F remains the same.

The modulated force approach is also applied to the samples which were measured using state-of-the-art contact mode SSRM as shown in FIGS. 2a-b. FIGS. 5a-c show the result of this measurement. FIG. 5a shows that when measuring the stack of 5 doped layers using the disclosed force-modulated SSRM, the measured resistance also varies. FIG. 5b shows the resistance-force curves for each doped layer, whereby the force is modulated around a DC or offset value: $F(t)=F_{offset} \pm (\Delta F/2)$, resulting in modulating the resistance around a DC value. In FIG. 5c, the amplitude ΔRmeas of the modulated measured resistance Rmeas is plotted as a function of the dopant concentration. Even for higher dopant concentrations and higher series resistance, a correlation remains between this amplitude and the dopant concentration of the sample 3. No saturation of the curves can be seen.

A schematic of such an SSRM measurement set-up 1 is shown in FIG. 6. It comprises a conductive AFM probe 2 configured to physically contact during the SSRM measurement a sample 3. Attached to this AFM probe are piëzo-electric elements configured to control the position of the AFM probe 2 and, hence, also the force applied by the AFM probe 2. The set-up 1 further comprises a contact electrode 4 for contacting the sample 3, thereby providing during the SSRM measurement a voltage bias over the sample 3. This contact electrode 4 can be part of a movable wafer stage configured to move the sample 3 at least in horizontal plane such that different positions on the sample 3 can be measured. The AFM probe 2 and the contact electrode 4 are electrically connected to a control unit 5. This control unit 5 provides the voltage bias to the AFM probe 2 and the contact electrode 4, it controls the position of both 2, 4 and receives the signal obtained during the SSRM measurement. This signal will be further processed in the control unit 5, thereby delivering the spreading resistance Rsp per measurement position on the sample 3.

This control unit 5 can further comprise a linear current-to-voltage amplifier 6 to convert the current into a voltage signal from which the resistance amplitude signal can be derived as there is a linear relationship between the measured resistance and the output signal. FIG. 7 illustrates such an amplifier 6 and its operation. The measured resistance signal can be written as: $R=-R_{ref} \cdot V_{bias}/V_{out}$ with $V_{bias}=R_{ref} \cdot I_{ref}=R \cdot I$. The current Iref is the current though the reference resistance Rref when a DC bias Vbias is applied across it, and R is the measured resistance value corresponding to the measured current signal I flowing under the bias Vbias applied over the sample 3.

FIG. 8 schematically shows a more detailed schematic of the measurement set-up 1 shown in FIG. 6. The control unit 5 comprises a linear current-to-voltage amplifier 6, which is connected to a Fast Fourier Transform unit 7.

The invention claimed is:

1. A method for determining local resistivity and carrier concentration of a sample using a scanning spreading resistance measurement set-up, the method comprising:
   contacting a sample at one side with an atomic force microscope (AFM) probe thereby applying a contact force to the sample at a particular position;
   contacting the sample at another side with a contact electrode;
   while maintaining contact with the sample by the AFM probe and the contact electrode, varying the contact force at the particular position;
   measuring, in response to varying the contact force at the particular position, a corresponding variation in resistance of the sample; and
   deriving from the variation in resistance a resistivity decoupled from a spreading resistance of the sample and a carrier concentration of the sample.

2. The method of claim 1, wherein varying the contact force comprises modulating an amplitude of the contact force with a modulation frequency while maintaining contact, and wherein measuring the sample resistance variation comprises deriving from the corresponding modulated sample resistance a resistance amplitude at the modulation frequency.

3. The method of claim 2, wherein the resistance amplitude is derived using Fast Fourier Transformation.

4. The method of claim 2, wherein measuring the sample resistance variation comprises measuring a current through the sample and converting the measured current to a resistance using a current-to-voltage amplifier.

5. The method of claim 1, further comprising:
   modulating, at a modulation frequency, the contact force applied to maintain physical contact between the AFM probe and the sample, while preserving the physical contact, thereby modulating at the modulation frequency the spreading resistance of the sample;
   measuring the current flowing through the sample between the AFM probe and the contact electrode; and
   deriving from the measured current the modulated spreading resistance.

6. The method of claim 5, wherein deriving the modulated spreading resistance further comprises:
   measuring spreading current using a current-to-voltage amplifier thereby converting a current signal into a resistance signal; and
   filtering out from the resistance signal a resistance amplitude at the modulation frequency.

7. The method of claim 6, wherein filtering out from the resistance signal the resistance amplitude comprises using a lock-in amplifier tuned to the modulation frequency.

8. The method of claim 6, wherein filtering out from the resistance signal the resistance amplitude comprises:
   using Fast Fourier Transformation; and
   selecting a signal at the modulation frequency.

* * * * *